United States Patent
Steinmann et al.

(10) Patent No.: US 8,310,318 B2
(45) Date of Patent: Nov. 13, 2012

(54) METHOD FOR CONTROLLING A DEVICE BY MEANS OF PULSE DURATION MODULATION AND CONTROL SYSTEM

(75) Inventors: Uwe Steinmann, Nierstein (DE); Klaus Pochner, Ruesselsheim (DE); Ritesh Arenja, Heidelberg (DE)

(73) Assignee: GM Global Technology Operations LLC, Detroit, MI (US)

( * ) Notice: Subject to any disclaimer, the term of this patent is extended or adjusted under 35 U.S.C. 154(b) by 5 days.

(21) Appl. No.: 12/910,399

(22) Filed: Oct. 22, 2010

(65) Prior Publication Data

US 2011/0169541 A1    Jul. 14, 2011

(30) Foreign Application Priority Data

Oct. 22, 2009  (DE) .......................... 10 2009 050 355
Sep. 14, 2010  (DE) .......................... 10 2010 045 292

(51) Int. Cl.
    *H03K 3/017*   (2006.01)
(52) U.S. Cl. ........................................ 332/109; 327/172
(58) Field of Classification Search .................. 332/109; 327/172
    See application file for complete search history.

(56) References Cited

U.S. PATENT DOCUMENTS

| 3,530,353 A |   | 9/1970 | Thompson |
| 5,606,296 A | * | 2/1997 | Seong ........................... 332/109 |
| 7,453,250 B2 | * | 11/2008 | Qiu et al. ...................... 323/288 |

FOREIGN PATENT DOCUMENTS

DE    19927903 A1    12/2000

OTHER PUBLICATIONS

German Patent Office, German Search Report for Application No. 102010045292.0, dated Jul. 1, 2011.

* cited by examiner

*Primary Examiner* — Joseph Chang
(74) *Attorney, Agent, or Firm* — Ingrassia Fisher & Lorenz, P.C.

(57) ABSTRACT

A method is provided for controlling an actuator that can be switched into an on state and an off state by means of pulse duration modulation, as well as to a control system. The inventive method includes, but is not limited to defining a standard pulse repetition period for the square wave signal for a range of a nominal pulse-duty factor, and increasing the pulse repetition period of the square wave signal referred to the standard pulse repetition period if a nominal pulse-duty factor falls short of a first lower threshold value and/or if a nominal pulse-duty factor exceeds a first upper threshold value.

17 Claims, 4 Drawing Sheets

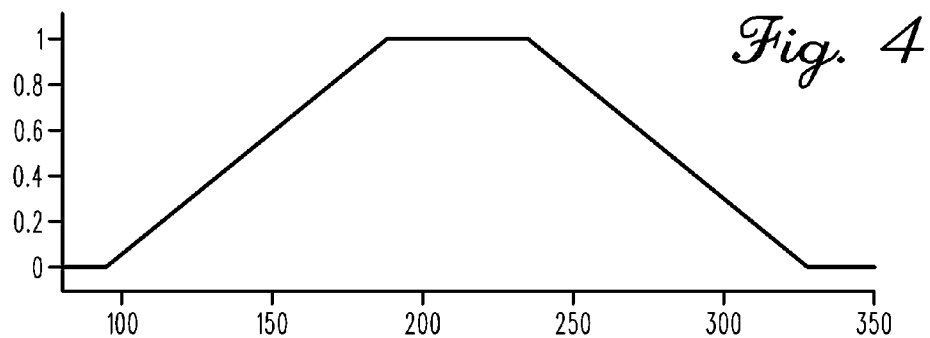
Fig. 4
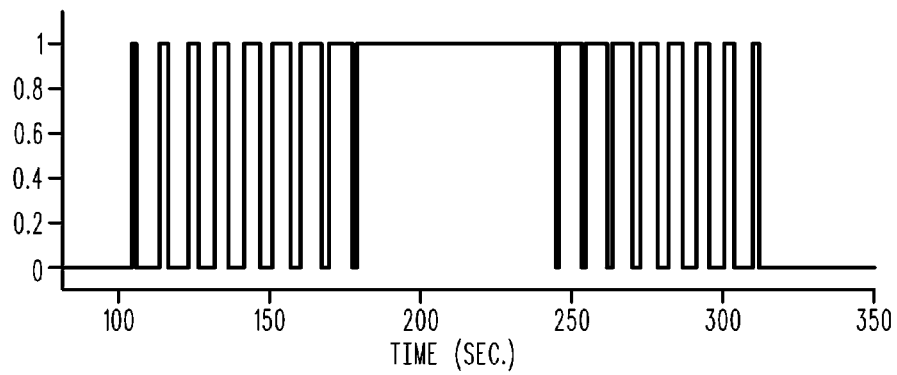
TIME (SEC.)
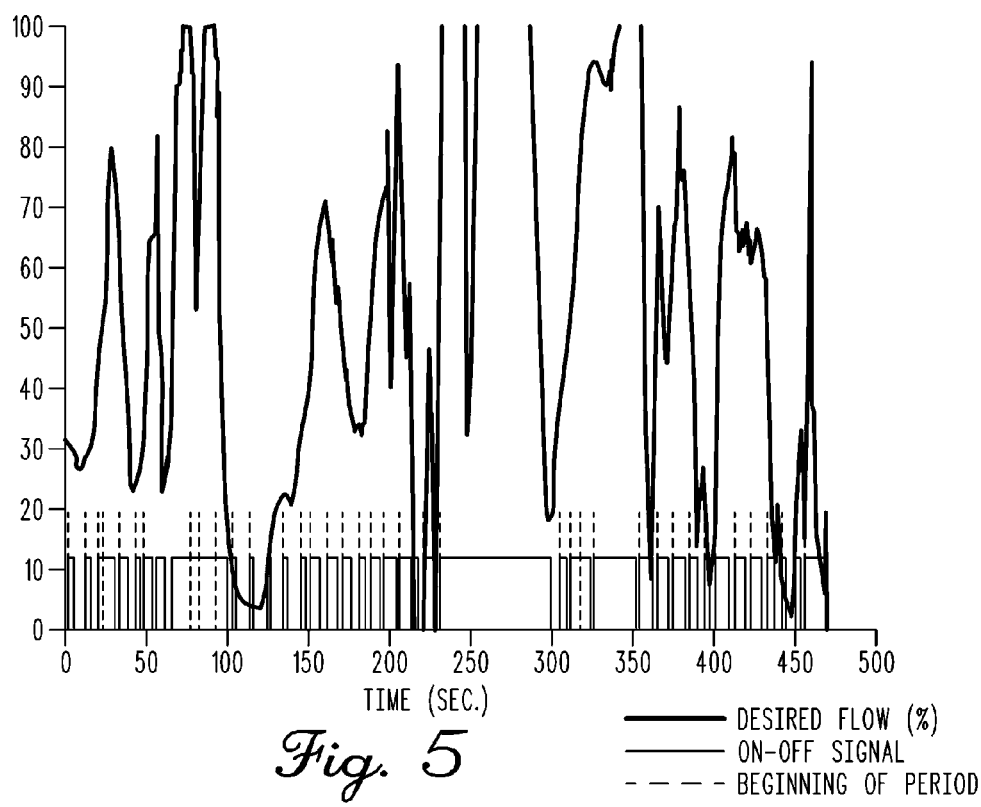
TIME (SEC.)
——— DESIRED FLOW (%)
——— ON-OFF SIGNAL
- - - - BEGINNING OF PERIOD
Fig. 5

METHOD FOR CONTROLLING A DEVICE BY MEANS OF PULSE DURATION MODULATION AND CONTROL SYSTEM

CROSS-REFERENCE TO RELATED APPLICATION

This application claims priority to German Patent Application No. 102010045292.0, filed Sep. 14, 2010, and claims priority to German Patent Application No. 102009050355.2, filed Oct. 22, 2009, which are incorporated herein by reference in its entirety.

TECHNICAL FIELD

The technical field pertains to a method for controlling a device that can be switched into an "on" state and an "off" state by means of pulse duration modulation of a square wave signal. The technical field furthermore pertains to a control system for controlling a device that can be switched into an "on" state and an "off" state by means of pulse duration modulation of a square wave signal.

BACKGROUND

Pulse duration modulation is a known method for controlling the power of an actuator that can only have the states ON and OFF. According to this method, the ratio between the duration of the switched-on state and the pulse repetition period, namely the so-called "pulse-duty factor," is defined within one period of a periodic square wave signal in such a way that the desired power is on hand averaged in time. In slow actuators, however, this method reaches its limits referred to the pulse-duty factors zero and 100% if the pulse repetition period should not be set to an immeasurably high value. This is the reason why it is common practice to specify threshold values for the pulse-duty factor, for example 20% and 80%, wherein only the states ON and OFF exist outside the threshold values.

Consequently, it is at least one objective to develop a method for controlling a device that can be switched into an ON state and an OFF state by means of pulse duration modulation, wherein said method makes it possible to also control the power of an actuator in the lower and upper fringe range. It is at least another objective to develop a control system that makes it possible to control the power of an actuator in this fringe range. In addition, other objectives, desirable features and characteristics will become apparent from the subsequent summary and detailed description, and the appended claims, taken in conjunction with the accompanying drawings and this background.

SUMMARY

According to an embodiment of the invention, a standard pulse repetition period for the square wave signal is defined for a range of a nominal pulse-duty factor in a step. In another step of the method, the pulse repetition period of the square wave signal is increased referred to the standard pulse repetition period if a nominal pulse-duty factor falls short of a first lower threshold value and/or if a nominal pulse-duty factor exceeds a first upper threshold value. The nominal pulse-duty factor results from the power demand on the actuator and specifies the pulse-duty factor that should be assumed by the actuator. The extended pulse repetition period makes it possible to also convert nominal pulse-duty factors in the fringe ranges around zero or 100% into a corresponding power of the actuator.

The first lower threshold value and the first upper threshold value preferably define the range of the nominal pulse-duty factor, in which the pulse repetition period corresponds to the standard pulse repetition period. This ensures that the standard pulse repetition period is used for average pulse-duty factors and the pulse repetition period is only extended for pulse-duty factors in the fringe ranges.

It is furthermore preferred that the currently running period can be aborted if the nominal pulse-duty factor should be changed. This makes it possible to quickly react to changes in the desired power of the actuator.

The current period can be additionally or alternatively extended or shortened when the nominal pulse-duty factor changes. It is preferred to shorten the current period if a higher power is required and to extend the current period if a lower power is required. The period is preferably shortened or extended if the change of the nominal pulse-duty factor lies below an abort threshold, wherein the current period is aborted when the abort threshold is reached or exceeded.

The method makes it possible to control, in particular, low-frequency actuators by means of pulse duration modulation over a broad bandwidth of the nominal pulse-duty factor. The flexible specification of the pulse repetition period furthermore makes it possible to reduce the switching frequency of the actuator.

A control system is designed in such a way that it carries out the method. The control system comprises, in particular, a computation unit that is realized in such a way that it determines a pulse repetition period and an ON state duration in dependence on a nominal pulse-duty factor and forwards the corresponding values to a signal generating unit of the control system in order to generate a square wave signal for switching the actuator. The computation unit is designed in such a way that it increases the pulse repetition period of the square wave signal relative to a standard pulse repetition period if a nominal pulse-duty factor falls short of a first lower threshold value and/or if a nominal pulse-duty factor exceeds a first upper threshold value.

BRIEF DESCRIPTION OF THE DRAWINGS

The present invention will hereinafter be described in conjunction with the following drawing figures, wherein like numerals denote like elements, and:

FIG. 4 shows two diagrams, wherein the upper diagram represents a requested time-dependent nominal pulse-duty factor in dependence on the time and the lower diagram represents the square wave signal generated by the control system for this requested nominal pulse-duty factor;

FIG. 5 shows a diagram that represents a pulse duration modulation of a square wave signal when a desired power is specified.

DETAILED DESCRIPTION

The following detailed description is merely exemplary in nature and is not intended to limit application and uses. Furthermore, there is no intention to be bound by any theory presented in the preceding background of the invention or the following detailed description.

Figure 1:
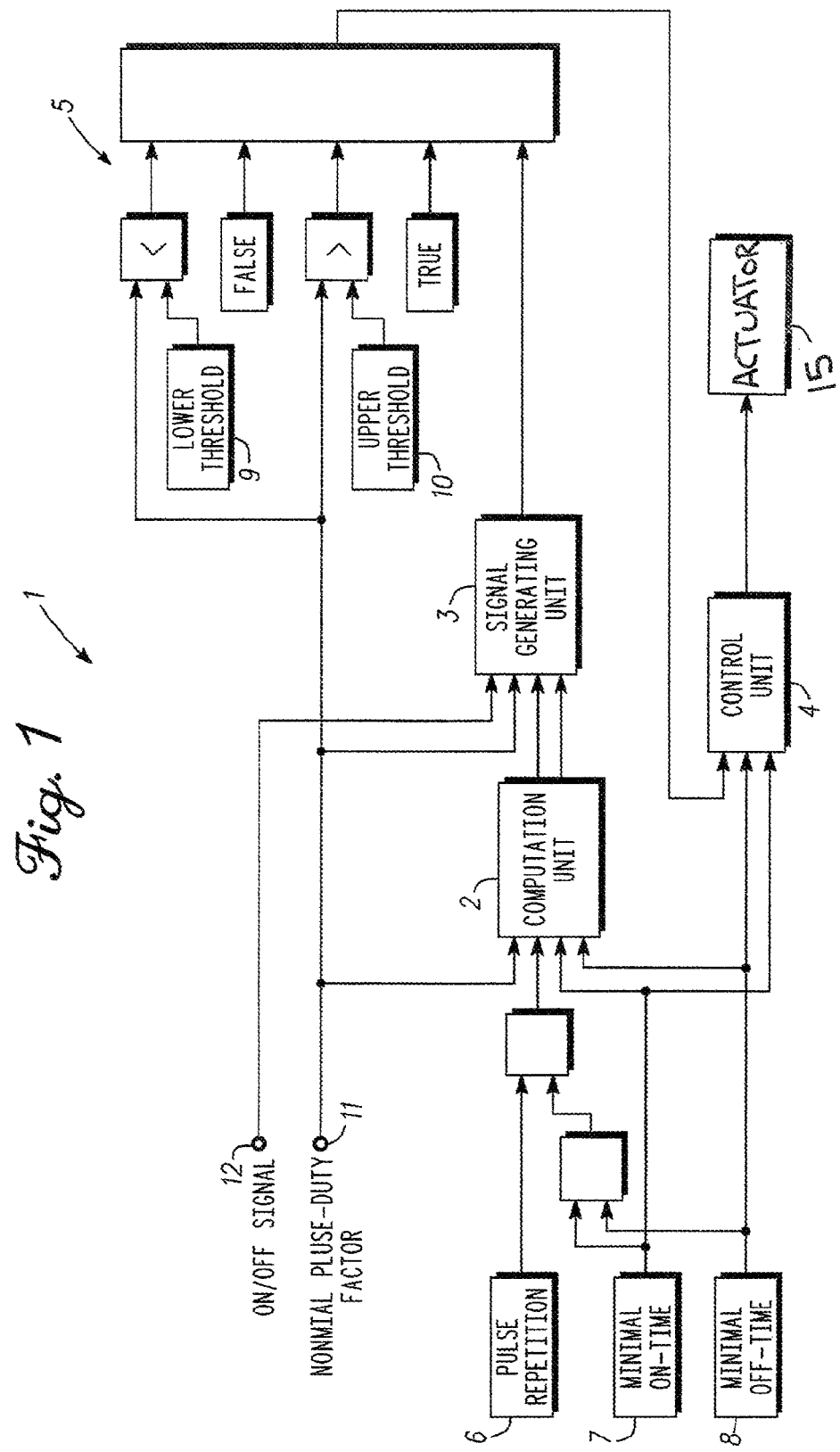
FIG. 1 shows a diagram of an embodiment of the control system.

FIG. 1 shows a first embodiment of an inventive control system 1 for controlling an actuator 15 that can be switched into an ON state and an OFF state by means of pulse duration modulation of a square wave signal, namely in the form of a diagram. The control system 1 comprises a computation unit 2, a signal generating unit 3, a control unit 4 and a comparison unit 5. The computation unit 2 is realized in such a way that it determines a pulse repetition period and an ON state duration in dependence on a nominal pulse-duty factor 11 and forwards the corresponding values to the signal generating unit 3 in order to generate a square wave signal for switching the actuator 15. The nominal pulse-duty factor 11 corresponds to the power demand on the actuator 15.

In addition to the nominal pulse-duty factor 11, the computation unit 2 uses a standard pulse repetition period 6, a minimal on-time 7 and a minimal off-time 8 of the actuator to be switched as input variables for determining the pulse repetition period and the ON state duration. The standard pulse repetition period is selectable, but has at least a value that corresponds to the sum of the minimal on-time 7 and the minimal off-time 8. The minimal on-time 7 indicates a minimum time, during which the square wave signal needs to assume the ON state, and the minimal off-time indicates a minimum time, during which the square wave signal needs to assume the OFF state. The minimal on-time 7 and the minimal off-time 8 take into account the switching speed of the actuator to be switched.

The computation unit 2 is designed in such a way that it increases the pulse repetition period of the square wave signal relative to a standard pulse repetition period if a nominal pulse-duty factor 11 falls short of a first lower threshold value and/or if a nominal pulse-duty factor 11 exceeds a first upper threshold value. The first lower threshold value and the first upper threshold value result from the standard pulse repetition period 6 and the minimal on-time 7, as well as the minimal off-time 8, wherein the first lower threshold value is equal to the minimal off-time 7 divided by the standard pulse repetition period 6 and the first upper threshold value is equal to the difference (standard pulse repetition period 6 minus minimal off-time 8) divided by the standard pulse repetition period 6.

The computation unit 2 extends the pulse repetition period in dependence on the minimal on-time 7 and the minimal off-time 8. If the first threshold value is not reached, the pulse repetition period is preferably increased relative to the standard pulse repetition period 6 in such a way that the duration of the ON state resulting for this nominal pulse-duty factor corresponds to the minimal on-time 7. However, if the nominal pulse-duty factor 11 exceeds the first upper threshold value, the pulse repetition period is preferably extended in such a way that the duration of the OFF state within the period corresponds to the minimal off-time.

The signal generating unit 3 generates a square wave signal for controlling the actuator. The square wave signal is periodic, wherein the period begins with an ON state. The pulse repetition period and the duration of the ON state are set to the values received from the computation unit 2. Another input parameter for the signal generating unit 3 is an ON/OFF signal 12 that indicates whether the actuator is switched on or off. A square wave signal for controlling the actuator is only generated when the actuator is switched on.

The signal generating unit 3 is designed in such a way that it aborts the current period during a change of the nominal pulse-duty factor 11 if the change of the nominal pulse-duty factor 11 is greater than or equal to an abort threshold. The change of the nominal pulse-duty factor 11 results from the difference between the nominal pulse-duty factor 11 and an actual pulse-duty factor. The actual pulse-duty factor is either the pulse-duty factor of the last completed period or the pulse-duty factor that results from the on-time and the last pulse repetition period at the time the actuator is switched off depending on which of the two pulse-duty factors is more current. The current period can be extended or shortened if the change of the nominal pulse-duty factor 11 is smaller than the abort threshold. A shortening of the period to a value below the standard period is preferably not carried out, but basically also possible. An abortion of the current period and the beginning with a new period or the extending or shortening of the current period make it possible for the control system 1 to quickly react to a change in the power demand. One preferred value for the abort threshold is defined in that the nominal pulse-duty factor exceeds the actual pulse-duty factor by at least 50%.

The square wave signal generated by the signal generating unit 3 is forwarded to a comparison unit 5. Other input parameters for the comparison unit 5 are a second lower threshold value 9 and a second upper threshold value 10. The second lower threshold value 9 and the second upper threshold value 10 define a range, outside of which the actuator respectively assumes the OFF state or the ON state without consideration of the demanded power. The second threshold values 9, 10 may be specified in the comparison unit 5 or be selectable variable parameters.

The comparison unit 5 is designed in such a way that it checks the nominal pulse-duty factor 11 of the square wave signal generated by the signal generating unit 3 as to the fact whether it lies within the range defined by the second lower threshold value 9 and the second upper threshold value 10. If this is the case, the square wave signal generated by the signal generating unit 3 is forwarded to the control unit 4. Otherwise, the square wave signal is set to the OFF state during the entire period if the nominal pulse-duty factor 11 falls short of the second lower threshold value 9 and set to the ON state during the entire period if the nominal pulse-duty factor 11 exceeds the second upper threshold value 10.

The minimal on-time 7 and the minimal off-time 8 are additional input parameters for the control unit 4. The control unit 4 is designed in such a way that, when the current period is aborted, the current period is at least continued for so long that the minimal on-time 7 is reached or exceeded in an ON state of the square wave signal and/or the minimal off-time 8 of the device to be switched is reached or exceeded in an OFF state. This is realized by comparing the pattern of the square wave signal up to this point with the minimal on-time 7 and/or the minimal off-time 8. This ensures that the minimal on-time 7 and the minimal off-time 8 are reached. For example, a gentle operation of the actuator can be achieved in this way.

Figure 2:
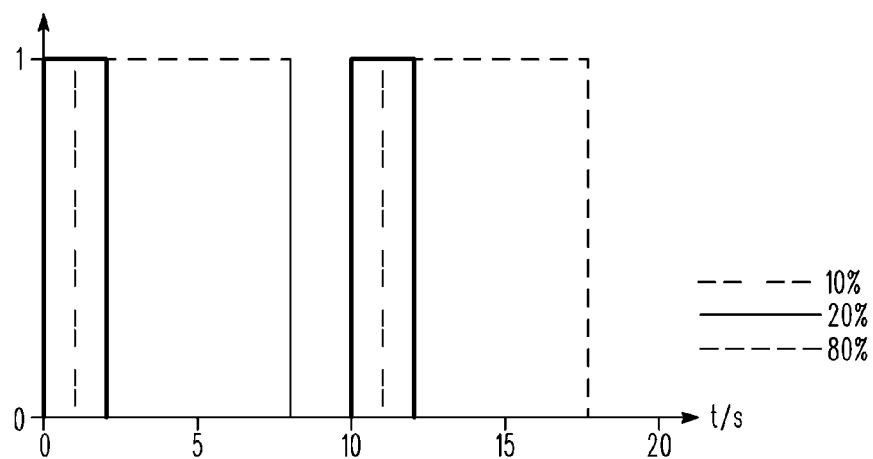
FIG. 2 shows a diagram that represents a square wave signal for different nominal pulse-duty factors at a standard pulse repetition period of 10 seconds.
Figure 3:
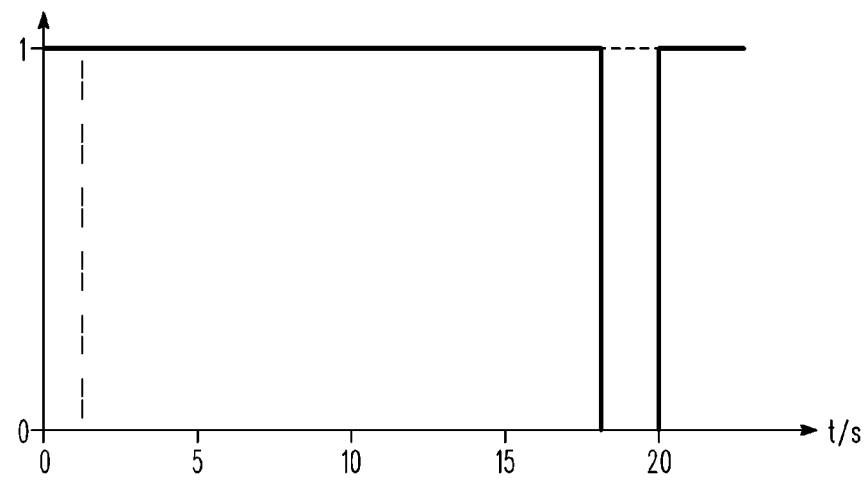
FIG. 3 shows a diagram that represents a square wave signal for different nominal pulse-duty factors at a pulse repetition period that is extended referred to the standard pulse repetition period.

FIG. 2 and FIG. 3 show several examples of square wave signals for controlling an actuator that were generated with the control system 1 and with the method carried out by this control system. In this exemplary embodiment, the actuator is a switchable water pump for use in a motor vehicle with internal combustion engine. The minimal on-time 7 is set to one sec. and the minimal off-time 8 is set to two sec. The standard pulse repetition period 6 amounts to 10 sec. for a range of the nominal pulse-duty factor that is defined by a first lower threshold value of 10% and a first upper threshold value of 80%.

FIG. 2 shows the periodic square wave signal generated with the control system 1 for nominal pulse-duty factors of 10%, 20% and 80% at a standard pulse repetition period 6 of 10 sec. If the power demand changes such that the related nominal pulse-duty factor lies outside the range of 10% to 80%, the pulse repetition period is increased relative to the standard pulse repetition period 6 in the above-described fashion by the control system 1. FIG. 3 shows the square wave signal generated by the control system 1 for nominal pulse-duty factors of 5% and 90%. In this case, the pulse repetition period was increased to 20 sec. The square wave signal is respectively set into the ON state or into the OFF over the entire period above the second upper threshold value 10 that amounts, for example, to 95% and below the second lower threshold value 9 that amounts, for example, to 5%.

FIG. 4 shows two diagrams. The upper diagram represents a requested nominal pulse-duty factor in dependence on the time and the lower diagram represents the square wave signal generated for this requested nominal pulse-duty factor by the control system 1. The diagrams elucidate that the actuator is not switched until the requested nominal pulse-duty factor reaches or exceeds a second lower threshold value 9. The actuator constantly remains in the "on" state if the requested nominal pulse-duty factor exceeds a second upper threshold value 10.

FIG. 5 shows a diagram that represents, for example, a square wave signal 13 generated within an inventive control system and with the inventive method as a function of the time for a power demand that changes over time, namely the desired volumetric flow rate of a pump in this case. The nominal pulse-duty factor 11 corresponds to the power demand. The period that was dynamically changed with respect to its duration in accordance with the inventive method is identified by the reference symbol 14.

Figure 6:
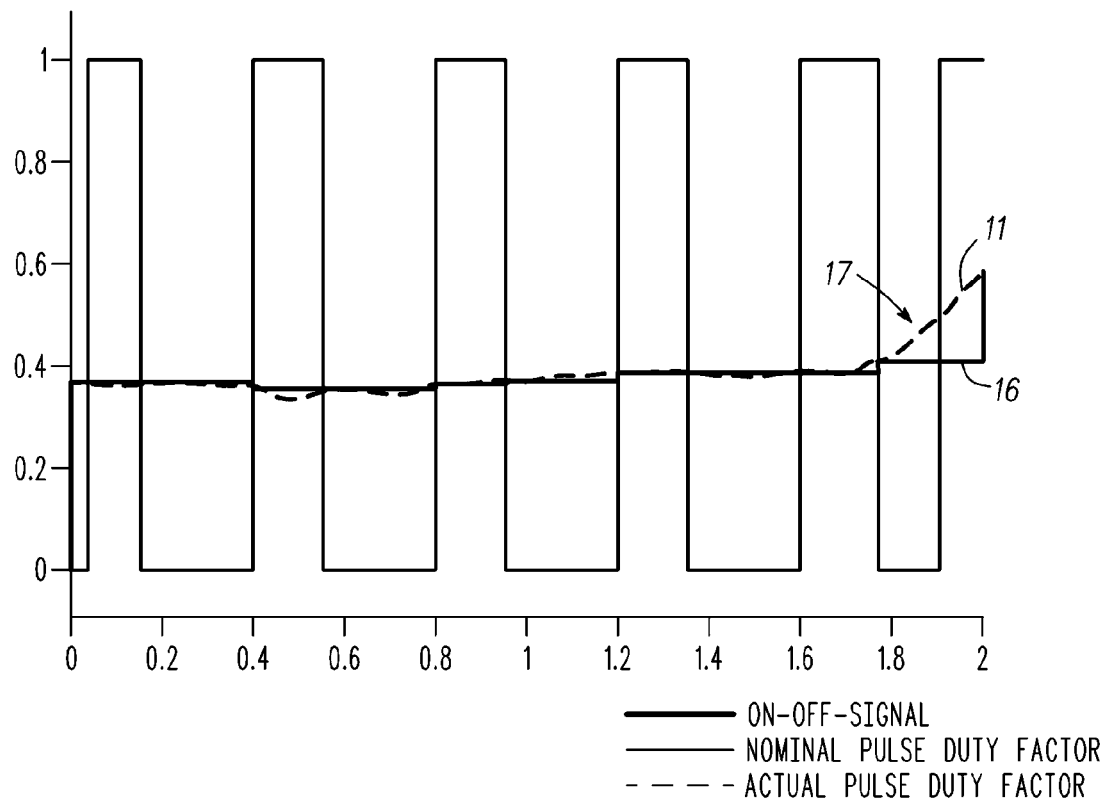
FIG. 6 shows a diagram that represents a pulse duration modulation of a square wave signal when a desired nominal pulse-duty factor is specified, namely including the instance in which an abort threshold is exceeded by changing the nominal pulse-duty factor.

FIG. 6 shows a diagram that represents a pulse duration modulation of a square wave signal when a desired nominal pulse-duty factor is specified, namely including the instance in which an abort threshold is exceeded by changing the nominal pulse-duty factor 11. This figure also shows the actual pulse-duty factor 16. According to FIG. 6, the current period is aborted and a new period begins when the abort threshold identified by the reference symbol 17 is reached.

The aforementioned switchable water pump consists of a mechanically driven pump in a water circuit that serves for cooling the engine in the ON state. It is also possible to utilize an additional electric pump that is controlled in the same fashion. The function of the water pump is based on the fact that a hot engine consumes significantly less fuel and produces fewer exhaust emissions than a cold engine. The objective therefore consists of only pumping as much water as required for cooling the engine by means of the switchable water pump.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. A method for controlling a device that can be switched into an on state and an off state by means of pulse duration modulation of a square wave signal, comprising the steps of:
    defining a standard pulse repetition period for the square wave signal for a range of a nominal pulse-duty factor;
    increasing a pulse repetition period of the square wave signal referred to the standard pulse repetition period if the nominal pulse-duty factor falls short of a first lower threshold value; and
    increasing the pulse repetition period of the square wave signal referred to the standard pulse repetition period if the nominal pulse-duty factor exceeds a first upper threshold value, wherein the pulse repetition period is increased in dependence on a minimal on-time of the device to be switched.

2. The method according to claim 1, wherein the pulse repetition period is increased in dependence on a minimal off-time of the device to be switched.

3. The method according to claim 1, wherein the square wave signal begins with an "on" state within a period.

4. The method according to claim 1, furthermore comprising the step of:
    aborting a current period and continuing with a new period if a change of the nominal pulse-duty factor is greater than or equal to an abort threshold; and
    adjusting the current period if the change of the nominal pulse-duty factor is smaller than the abort threshold.

5. The method according to claim 4, wherein the current period is adjusted in dependence on a minimal on-time of the device to be switched, wherein the current period is preferably continued at least until the minimal on-time is at least reached in an on state of the square wave signal.

6. The method according to claim 4, wherein the current period is adjusted in dependence on a minimal on-time of the device to be switched, wherein the current period is preferably continued at least until a minimal off-time to be switched is at least reached in the off state of the square wave signal.

7. The method according to claim 4, wherein the current period is adjusted in dependence on a minimal off-time of the device to be switched, wherein the current period is preferably continued at least until a minimal on-time is at least reached in an on state of the square wave signal.

8. The method according to claim 4, wherein the current period is adjusted in dependence on a minimal off-time of the device to be switched, wherein the current period is preferably continued at least until the minimal off-time to be switched is at least reached in the off state of the square wave signal.

9. The method according to claim 1, furthermore comprising the step of setting the square wave signal to the off' state over an entire period if a second lower threshold value for the nominal pulse-duty factor is not reached.

10. The method according to claim 1, furthermore comprising the step of setting the square wave signal to the "on" state over an entire period if a second upper threshold value for the nominal pulse-duty factor is exceeded.

11. A control system for controlling an actuator that can be switched into an on state and an off state by means of pulse duration modulation of a square wave signal, comprising:
    a computation unit; and
    a signal generating unit,
    wherein the computation unit is adapted to determine a pulse repetition period and an on state duration in dependence on a nominal pulse-duty factor and forward corresponding values to the signal generating unit in order to generate the square wave signal for switching the actuator, wherein the computation unit is adapted to increases the pulse repetition period of the square wave signal relative to a standard pulse repetition period if a nominal pulse-duty factor falls short of a first lower threshold value, wherein the computation unit is adapted to increases the pulse repetition period of the square wave signal relative to the standard pulse repetition period if a nominal pulse-duty factor exceeds a first upper threshold value, and wherein the signal generating unit is adapted to aborts a current period when the nominal pulse-duty factor changes.

12. The control system according to claim 11, wherein the signal generating unit is adapted to adjust the current period when the nominal pulse-duty factor changes.

13. The control system according to claim 11, further comprising a control unit adapted to continue the current period at least until a minimal on-time is at least reached in an on state of the square wave signal if the current period is aborted.

14. The control system according to claim 11, further comprising a control unit adapted to continue the current period at least until a minimal off-time of a device to be switched is at least reached in the off state of the square wave signal if the current period is aborted.

15. The control system according to claim 11, further comprising a comparison unit adapted to set the square wave signal to the off state over an entire period if the nominal pulse-duty factor falls short of a second lower threshold value.

16. The control system according to claim 11, further comprising a comparison unit adapted to set setting the square wave signal is set to the on state over an entire period if the nominal pulse-duty factor exceeds a second upper threshold value.

17. A method for controlling a device that can be switched into an on state and an off state by means of pulse duration modulation of a square wave signal, comprising the steps of:

defining a standard pulse repetition period for the square wave signal for a range of a nominal pulse-duty factor;

increasing a pulse repetition period of the square wave signal referred to the standard pulse repetition period if the nominal pulse-duty factor falls short of a first lower threshold value; and increasing the pulse repetition period of the square wave signal referred to the standard pulse repetition period if the nominal pulse-duty factor exceeds a first upper threshold value that is different than the first lower threshold value.

* * * * *